(12) United States Patent
Xue et al.

(10) Patent No.: US 9,312,788 B2
(45) Date of Patent: Apr. 12, 2016

(54) CONTROL DEVICE OF POWER CONVERSION UNIT AND METHOD OF CONTROLLING POWER CONVERSION UNIT

(71) Applicant: Delta Electronics (Shanghai) Co., Ltd., Shanghai (CN)

(72) Inventors: Hai-Fen Xue, Shanghai (CN); Li Cai, Shanghai (CN); Chao Tian, Shanghai (CN); Dian-Chen Zheng, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 14/602,277

(22) Filed: Jan. 22, 2015

(65) Prior Publication Data
US 2015/0236615 A1 Aug. 20, 2015

(30) Foreign Application Priority Data

Feb. 18, 2014 (CN) .......................... 2014 1 0055260

(51) Int. Cl.
| | |
|---|---|
| *H02M 7/44* | (2006.01) |
| *H02M 7/537* | (2006.01) |
| *G01R 21/127* | (2006.01) |
| *G01R 25/00* | (2006.01) |
| *H02M 7/5387* | (2007.01) |
| *H02J 3/38* | (2006.01) |

(52) U.S. Cl.
CPC ............ *H02M 7/537* (2013.01); *G01R 21/127* (2013.01); *G01R 25/005* (2013.01); *H02J 3/381* (2013.01); *H02M 7/53875* (2013.01); *H02M 2007/53876* (2013.01)

(58) Field of Classification Search
CPC .................. H02M 7/537; H02M 2007/53876; H02M 7/53875; G01R 21/127; G01R 25/005
USPC .......................................................... 363/97
See application file for complete search history.

(56) References Cited

U.S. PATENT DOCUMENTS

| | | | | |
|---|---|---|---|---|
| 6,052,297 A | * | 4/2000 | Akamatsu et al. .............. | 363/84 |
| 6,573,691 B2 | | 6/2003 | Ma et al. | |
| 2009/0244934 A1 | * | 10/2009 | Wang et al. ................ | 363/21.06 |

FOREIGN PATENT DOCUMENTS

CN 102005763 A 4/2011

* cited by examiner

*Primary Examiner* — Adolf Berhane
*Assistant Examiner* — Afework Demisse
(74) *Attorney, Agent, or Firm* — CKC & Partners Co., Ltd.

(57) ABSTRACT

A control device and control method of power conversion unit applied to a three-phase AC grid. The control device includes detection unit, current detection unit, and signal processing unit. The detection unit detects three-phase voltage signal of the three-phase AC grid and calculates and generates negative sequence reactive current given signal. The current detection unit detects current of the power conversion unit to output feedback current signal. The signal processing unit receives the negative sequence reactive current given signal, positive sequence current given signal, and the feedback current signal to output modulation signal. The power conversion unit is electrically coupled to the signal processing unit and the three-phase AC grid. The power conversion unit absorbs negative sequence reactive currents from the three-phase AC grid according to the modulation signal when the three-phase voltage signal is unbalanced to reduce negative sequence voltage at output terminal of the power conversion unit.

34 Claims, 5 Drawing Sheets

CONTROL DEVICE OF POWER CONVERSION UNIT AND METHOD OF CONTROLLING POWER CONVERSION UNIT

RELATED APPLICATIONS

This application claims priority to China Application Serial Number 201410055260.9, filed Feb. 18, 2014, which is herein incorporated by reference.

BACKGROUND

1. Field of Invention

The present disclosure relates to a control technology of three-phase grid equipment. More particularly, the present disclosure relates to a control device of a power conversion unit and a method of controlling a power conversion unit.

2. Description of Related Art

Nowadays, with the development of technology and great enrichment of material life of human beings, the accompanying energy problems and environmental problems are becoming more and more serious. As a result, the development and utilization of renewable energy to solve the above-mentioned problems have become a critical direction of research and development, for example, wind power having the features of cleanliness and environmental friendliness is well deserved to be one of many types of renewable energy sources.

The common grid equipment includes the grid inverter for wind power and photovoltaic power, the reactive compensation device, the motor inverter for driving the motor, etc. When the three-phase voltage signal of the three-phase AC grid sags symmetrically in a short time, the above grid-connected equipment should remain not tripping and be able to quickly generate reactive currents to support the three-phase grid voltages so as to reduce the impact of grid voltage fault. However, when the three-phase voltage signal of the three-phase AC grid is asymmetrically faulty at a high voltage value, voltages of specific phases will be lower than a normal value and a voltage of a specific phase will be higher than the normal value. Under the circumstances, if the above equipment simply generates the reactive currents to support the three-phase grid voltages, the higher phase voltage will become even higher, which in turn leads to shutdown of the above-mentioned grid equipment due to a fault. Take the grid inverter for example, the magnitude of the DC busbar voltage of the grid inverter determines the peak value of the maximum inverted AC voltage, the phase grid voltage signal having an over high value will deteriorate its ability of controlling the grid current, thus saturating the modulation wave or even causing uncontrollable circumstances to happen.

For the forgoing reason, there is a need for solving the above-mentioned problem by providing a control device of a power conversion unit and a method of controlling a power conversion unit.

SUMMARY

A control device of a power conversion unit applied to a three-phase AC grid is provided. The control device comprises a detection unit, a current detection unit, a signal processing unit. The detection unit is configured for detecting a three-phase voltage signal of the three-phase AC grid and calculating and generating a negative sequence reactive current given signal. The current detection unit is configured for detecting a current of the power conversion unit to output a feedback current signal. The signal processing unit is configured for receiving the negative sequence reactive current given signal, a positive sequence current given signal, and the feedback current signal to output a modulation signal. The power conversion unit is electrically coupled to the signal processing unit and the three-phase AC grid. The power conversion unit absorbs negative sequence reactive currents from the three-phase AC grid according to the modulation signal when the three-phase voltage signal is unbalanced so as to reduce a negative sequence voltage at an output terminal of the power conversion unit.

The disclosure provides a method of controlling a power conversion unit applied to a three-phase AC grid. The method comprises: detecting a three-phase voltage signal of the three-phase AC grid and calculating and generating a negative sequence reactive current given signal by a detection unit; detecting a current of the power conversion unit to output a feedback current signal by a current detection unit; receiving the negative sequence reactive current given signal, a positive sequence current given signal, and the feedback current signal to output a modulation signal by a signal processing unit; and electrically coupling the power conversion unit to the signal processing unit and the three-phase AC grid, the power conversion unit absorbing negative sequence reactive currents from the three-phase AC grid according to the modulation signal when the three-phase voltage signal is unbalanced so as to reduce a negative sequence voltage at an output terminal of the power conversion unit.

It is advantageous to apply the present disclosure control device of the power conversion unit to detect the imbalance of the three-phase voltage signal of the three-phase AC grid, that is the fault of the three-phase AC grid. For example, the three-phase voltages symmetrically sag. The power conversion unit can absorb the negative sequence reactive currents from the three-phase AC grid according to the modulation signal so as to reduce the negative sequence voltage at the output terminal of the power conversion unit. As a result, the degree of imbalance at the output terminal of the power conversion unit is reduced to avoid a single phase voltage being over high. The objective of dynamically adjusting the imbalance of the three-phase voltage signal is thus achieved to guarantee the successful pass of low voltage ride through (LVRT) and high voltage ride through (HVRT).

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Reference will now be made in detail to the present embodiments of the disclosure, examples of which are illustrated in the accompanying drawings. Wherever possible, the same reference numbers are used in the drawings and the description to refer to the same or like parts.

Figure 1:
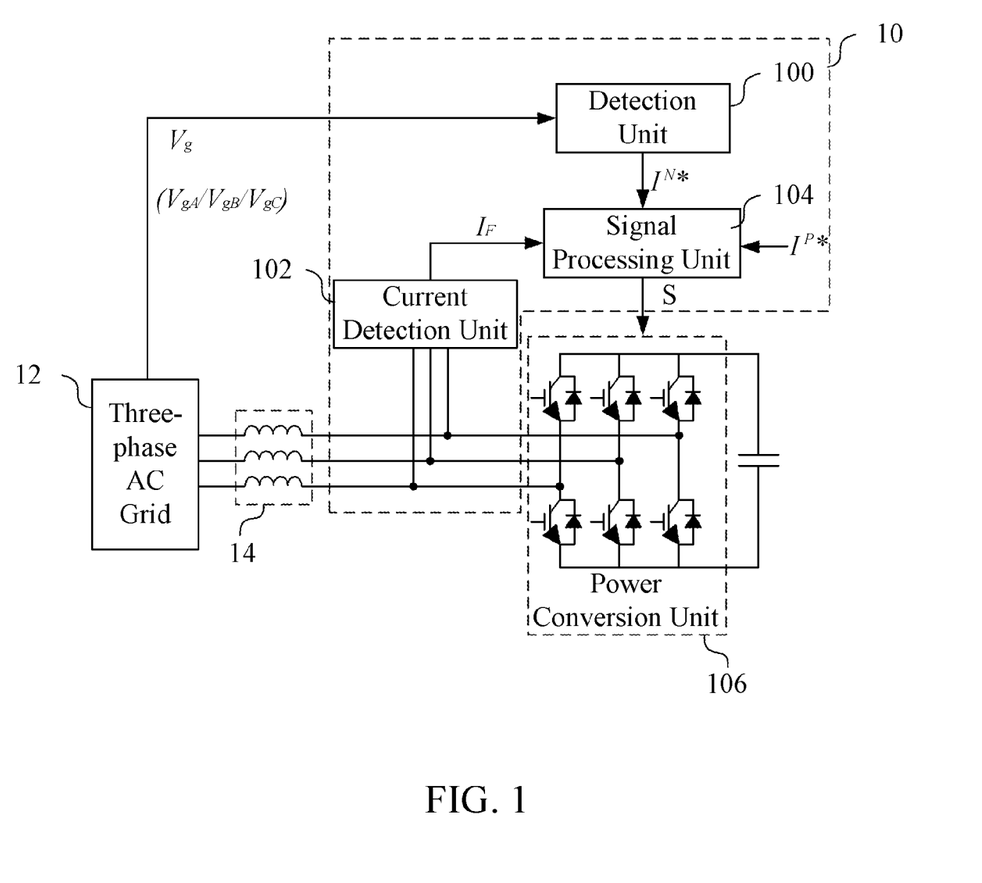
FIG. 1 depicts a schematic diagram of a control device of a power conversion unit, a power conversion unit, and a three-phase AC grid according to one embodiment of this disclosure.

FIG. 1 depicts a schematic diagram of a control device 10 of a power conversion unit, a power conversion unit 106, and a three-phase AC grid 12 according to one embodiment of this disclosure. The control device 10 comprises a detection unit 100, a current detection unit 102, and a signal processing unit 104.

The detection unit 100 receives a three-phase voltage signal of the three-phase AC grid 12, that is phase A voltage $V_{g\_A}$, phase B voltage $V_{g\_B}$, and phase C voltage $V_{g\_C}$. Due to the short circuit fault in power system, three-phase grid voltages sag. For example, when the three-phase voltage signal $V_g$ asymmetrically sags, the phase A voltage $V_{g\_A}$, the phase B voltage $V_{g\_B}$, and the phase C voltage $V_{g\_C}$ of the three-phase grid voltages are unequal to each other. That is, the three-phase voltage signal $V_g$ of the three-phase grid becomes unbalanced. Hence, the detection unit 100 can detect magnitudes of the phase A voltage $V_{g\_A}$, the phase B voltage $V_{g\_B}$, and the phase C voltage $V_{g\_C}$ so as to evaluate whether the three-phase grid voltages are unbalanced and the degree of imbalance, and calculate to generate a negative sequence reactive current given signal $I^{N*}$ based on the degree of imbalance.

In one embodiment, the ability that the power conversion unit 106 can absorb negative sequence reactive currents from the three-phase AC grid 12 and provide an active and/or reactive power can be defined by relevant parameters. The detection unit 100 calculates the negative sequence reactive current given signal $I^{N*}$ not only based on the degree of imbalance of the phase A voltage $V_{g\_A}$, the phase B voltage $V_{g\_B}$, and the phase C voltage $V_{g\_C}$ but also based on the ability that the power conversion unit 106 can absorb the negative sequence reactive currents and provide the active and/or reactive power. It is noted that the degree of imbalance of the three-phase voltage signal of the three-phase AC grid refers to deviations of the phase A voltage $V_{g\_A}$, the phase B voltage $V_{g\_B}$, and the phase C voltage $V_{g\_C}$ of the three-phase grid voltages from a normal value due to a grid system fault. Among the three-phase voltages, one specific phase voltage is lower than the normal value and another specific phase voltage is higher than the normal value.

The negative sequence reactive current given signal $I^{N*}$ is meant to calculate how much negative sequence reactive currents should be absorbed from the three-phase AC grid 12 by the power conversion unit 106 and how much positive sequence active and/or reactive currents should be generated to the three-phase AC grid 12, with the degree of imbalance of the three-phase voltage signal $V_g$, so as to balance the three-phase voltage signal $V_g$, that is the phase A voltage $V_{g\_A}$, the phase B voltage $V_{g\_B}$, and the phase C voltage $V_{g\_C}$.

The current detection unit 102 detects a current of the power conversion unit 106 so as to output a feedback current signal $I_F$. The feedback current signal $I_F$ represents the amount of current flowing between the power conversion unit 106 and the three-phase AC grid 12 at the instance. The signal processing unit 104 further receives the feedback current signal $I_F$, the negative sequence reactive current given signal $I^{N*}$, and a positive sequence current given signal $I^{P*}$ and outputs a modulation signal S after calculation. It is noted that the positive sequence current given signal $I^{P*}$ may be calculated from a DC busbar voltage of the power conversion unit 106, or may be preset as required.

In one embodiment, the power conversion unit 106 may comprise a plurality of insulated gate bipolar transistors (IGBTs) or a plurality of integrated gate-commutated thyristors (IGCTs) disposed corresponding to the three-phase grid. The power conversion unit 106 turns on or turns off the insulated gate bipolar transistors or the integrated gate-commutated thyristors according to the modulation signal S so as to absorb the negative sequence reactive currents or provide positive sequence active and/or reactive currents.

In one embodiment, the control device 10 is electrically connected to the three-phase AC grid 12 through filtering inductors 14. The provision of the positive sequence reactive currents through the filtering inductors 14 can increase positive sequence components of the three-phase voltage signal $V_g$. The absorbing of the negative sequence reactive currents through the filtering inductors 14 can reduce a negative sequence voltage at an output terminal of the power conversion unit 106, that is, negative sequence components of the three-phase voltage signal $V_g$. In this manner, the imbalance of the three-phase voltage signal $V_g$ is adjusted.

Figure 2A:
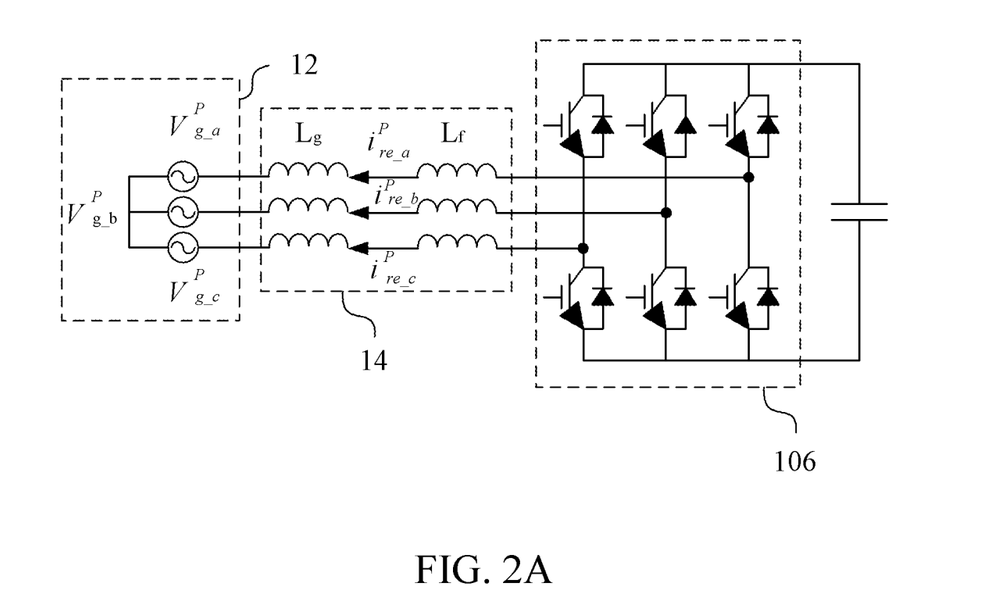
FIG. 2A is a positive sequence equivalent circuit diagram of the three-phase AC grid, the filtering inductors, and the power conversion unit in FIG. 1 according to one embodiment of this disclosure.
Figure 2B:
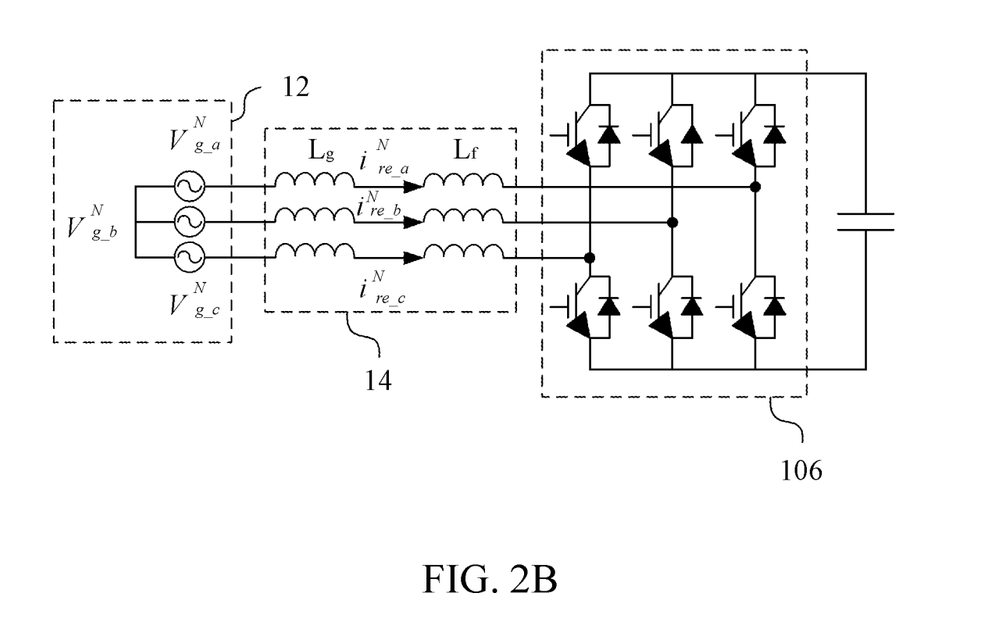
FIG. 2B is a negative sequence equivalent circuit diagram of the three-phase AC grid, the filtering inductors, and the power conversion unit in FIG. 1 according to one embodiment of this disclosure.

FIG. 2A is a positive sequence equivalent circuit diagram of the three-phase AC grid 12 and the power conversion unit 106 in FIG. 1 according to one embodiment of this disclosure. FIG. 2B is a negative sequence equivalent circuit diagram of the three-phase AC grid 12 and the power conversion unit 106 in FIG. 1 according to one embodiment of this disclosure. In the present embodiment, a filter 14 between the power conversion unit 106 and the three-phase AC grid 12 further comprises line impedances Lg and filtering inductors Lf. The filter 14 for each phase may comprise at least one filtering inductor.

Each of the electrical parameters of the three-phase AC grid 12 may be the superposition of the positive sequence equivalent circuit and the negative sequence equivalent circuit. In the positive sequence equivalent circuit, the positive sequence components of the three-phase voltage signal of the three-phase AC grid 12 comprise $V_{g\_a}^P$, $V_{g\_b}^P$, and $V_{g\_c}^P$, as shown in FIG. 2A. In the negative sequence equivalent circuit, the negative sequence components of the three-phase voltage signal of the three-phase AC grid 12 comprise $V_{g\_a}^N$, $V_{g\_b}^N$, and $V_{g\_c}^N$, as shown in FIG. 2B. Hence, a total voltage signal is equal to the superposition of the positive sequence components and the negative sequence components.

When the three-phase voltage signal is not balanced, the power conversion unit 106 can generate positive sequence reactive currents $i_{re\_a}^P$, $i_{re\_b}^P$, $i_{re\_c}^P$ based on sag depths of the positive sequence components so as to generate voltage drops across the line impedances Lg under the control of the modulation signal S, which is generated by cooperation of the detection unit 100, the current detection unit 102, the positive sequence current given signal $I^{ps}$, and the signal processing unit 104 in FIG. 1. The positive sequence components of the three-phase grid voltages are thus increased. In addition, the power conversion unit 106 can absorb negative sequence reactive currents $i_{re\_a}^N$, $i_{re\_b}^N$, $i_{re\_c}^N$ from the three-phase AC grid 12 based on magnitudes of negative sequence components of the three-phase grid voltages so as to drop a negative sequence voltage across the line impedances Lg and the filtering inductors Lf under the control of the modulation signal S, which is generated as described previously. The negative sequence voltage at an output terminal of the power conversion unit 106 is thus reduced. A voltage signal at the output terminal of the power conversion unit 106 is equal to the superposition of the positive sequence voltage and the negative sequence voltage at the output terminal of the power conversion unit 106. The reducing of the negative sequence voltage will reduce a total voltage at the output terminal of the power conversion unit 106, thus being advantageous to normal operation of the power conversion unit 106.

Figure 3:
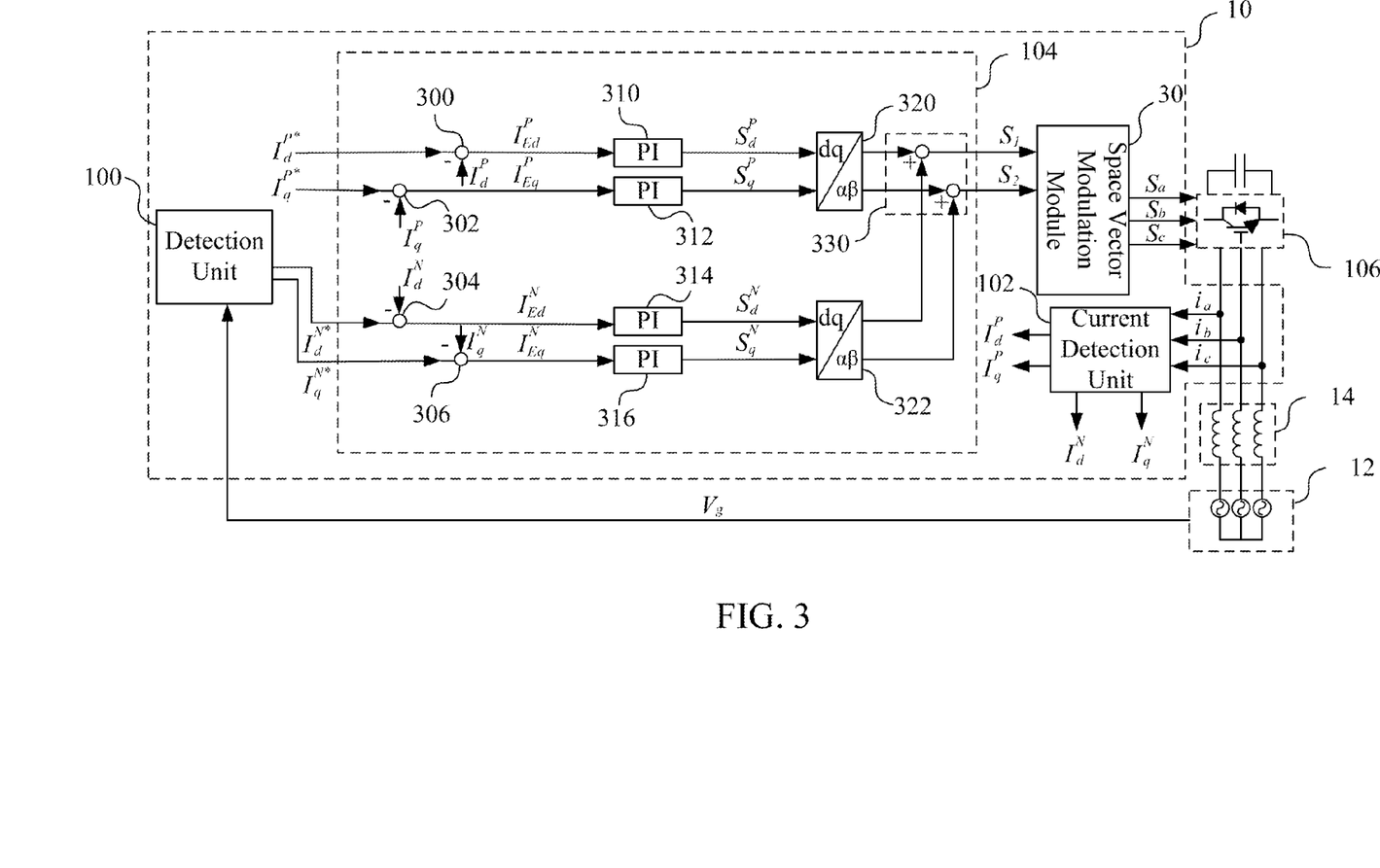
FIG. 3 is a detailed schematic diagram of a control device for a power conversion unit and a three-phase AC grid according to one embodiment of this disclosure.

FIG. 3 is a detailed schematic diagram of the control device 10, the power conversion unit 106, and the three-phase AC grid 12 according to one embodiment of this disclosure. In the present embodiment, the control device 10 further comprises a space vector modulation (SVM) module 30 besides the detection unit 100, the current detection unit 102, and the signal processing unit 104.

The current detection unit 102 receives currents $i_a$, $i_b$ and $i_c$ of the power conversion unit 106, as shown in FIG. 3 to generate the feedback current signal. The feedback current signal is separated by a positive and negative sequence separation module so as to output a positive sequence feedback current signal and a negative sequence feedback current signal. In one embodiment, the positive sequence feedback current signal in a positive dq coordinate (two phase rotating coordinate system) comprises a d-component $I_d^P$ (that is, the first axial positive sequence feedback current signal) and a q-component $I_q^P$ (that is, the second axial positive sequence feedback current signal). The negative sequence feedback current signal in a negative dq coordinate comprises a d-component $I_d^N$ (that is, the first axial negative sequence feedback current signal) and a q-component $I_q^N$ (that is, the second axial negative sequence feedback current signal). It is noted that, the first axis and the second axis may respectively refer to the d axis and the q axis of the dq coordinate system.

Similarly, the negative sequence reactive current given signal $I^{N*}$ generated based on the three-phase voltage signal $V_g$ by the detection unit 100 comprises a d-component $I_d^{N*}$ (that is, the first axial negative sequence reactive current given signal) and a q-component $I_q^{N*}$ (that is, the second axial negative sequence reactive current given signal) in the negative dq coordinate. The positive sequence current given signal comprises a d-component $I_d^{P*}$ (that is, the first axial positive sequence active current given signal) and a q-component $I_q^{P*}$ (that is, the second axial positive sequence reactive current given signal) in the positive dq coordinate. In one embodiment, the components of the negative sequence reactive current given signal in the negative dq coordinate are respectively equal to:

$$I_d^{N*} = (V_q^N/V^N)*I_R^N$$

$$I_q^{N*} = -(V_d^N/V^N)*I_R^N$$

where $V^N$ denotes a negative sequence grid voltage signal (that is, a negative sequence component of the three-phase AC grid voltage), $V_d^N$ denotes a d-component of the negative sequence grid voltage signal, $V_q^N$ denotes a q-component of the negative sequence grid voltage signal, and $I_R^N$ denotes a peak value of the negative sequence reactive current absorbed by the power conversion unit 106 from the three-phase AC grid 12.

According to the present embodiment, the signal processing unit 104 further comprises a positive sequence signal processing module and a negative sequence signal processing module. The positive sequence signal processing module comprises a first positive sequence error calculation module 300, a second positive sequence error calculation module 302, a first positive sequence proportion adjustment module 310, a second positive sequence proportion adjustment module 312, and a positive sequence coordinate transformation module 320 so as to process the positive sequence signals. That is, the positive sequence signal processing module receives the positive sequence feedback current signal and the positive sequence current given signal $I^{P*}$ to output positive sequence modulation signals. The negative sequence signal processing module comprises a first negative sequence error calculation module 304, a second negative sequence error calculation module 306, a first negative sequence proportion adjustment module 314, a second negative sequence proportion adjustment module 316, and a negative sequence coordinate transformation module 322 so as to process the negative sequence signals. That is, the negative sequence signal processing module receives the negative sequence feedback current signal and the negative sequence reactive current given signal $I^{N*}$ to output negative sequence modulation signals.

The first positive sequence error calculation module 300 outputs a d-component of a positive sequence error signal $I_{Ed}^P$ (that is, the first axial positive sequence error signal) based on the d-component of the positive sequence feedback current signal $I_d^P$ (that is, the first axial positive sequence feedback current signal) and the d-component of the positive sequence current given signal $I_d^{P*}$ (that is, the first axial positive sequence active current given signal). The second positive sequence error calculation module 302 outputs a q-component of the positive sequence error signal $I_{Eq}^P$ (that is, the second axial positive sequence error signal) based on the q-component of the positive sequence feedback current signal $I_q^P$ (that is, the second axial positive sequence feedback current signal) and the q-component of the positive sequence current given signal $I_q^{P*}$ (that is, the second axial positive sequence reactive current given signal).

Similarly, the first negative sequence error calculation module 304 outputs a d-component of a negative sequence error signal $I_{Ed}^N$ (that is, the first axial negative sequence error signal) based on the d-component of the negative sequence feedback current signal $I_d^N$ (that is, the first axial negative sequence feedback current signal) and the d-component of the negative sequence reactive current given signal $I_d^{N*}$ (that is, the first axial negative sequence reactive current given signal). The second negative sequence error calculation module 306 outputs a q-component of the negative sequence error signal $I_{Eq}^N$ (that is, the second axial negative sequence error signal) based on the q-component of the negative sequence feedback current signal $I_q^N$ (that is, the second axial negative sequence feedback current signal) and the q-component of the negative sequence reactive current given signal $I_q^{N*}$ (that is, the second axial negative sequence reactive current given signal).

The first positive sequence proportion adjustment module 310 receives the d-component of the positive sequence error signal $I_{Ed}^P$, and calculates and outputs a positive sequence proportion modulation signal $S_d^P$; corresponding to the d axis (that is, the first axial positive sequence proportion modulation signal). The second positive sequence proportion adjustment module 312 receives the q-component of the positive sequence error signal $I_{Ed}^P$, and calculates and outputs a positive sequence proportion modulation signal $S_q^P$ corresponding to the q axis (that is, the second axial positive sequence proportion modulation signal).

The first negative sequence proportion adjustment module 314 receives the d-component of the negative sequence error signal $I_{Ed}^N$, and calculates and outputs a negative sequence proportion modulation signal $S_d^N$ corresponding to the d axis (that is, the first axial negative sequence proportion modulation signal). The second negative sequence proportion adjustment module 316 receives the q-component of the negative sequence error signal $I_{Eq}^N$, and calculates and outputs a negative sequence proportion modulation signal $S_q^N$ corresponding to the q axis (that is, the second axial negative sequence proportion modulation signal).

The positive sequence coordinate transformation module 320 further receives the first axial positive sequence proportion modulation signal $S_d^P$ and the second axial positive sequence proportion modulation signal $S_q^P$ so as to perform coordinate transformation and output the positive sequence modulation signals. The negative sequence coordinate transformation module 322 further receives the first axial negative sequence proportion modulation signal $S_d^N$ and the second axial negative sequence proportion modulation signal $S_q^N$ so as to perform coordinate transformation and output the negative sequence modulation signals. In one embodiment, the positive sequence coordinate transformation module 320 and the negative sequence coordinate transformation module 322 respectively transform the first axial positive sequence proportion modulation signal, the second axial positive sequence proportion modulation signal, the first axial negative sequence proportion modulation signal, and the second axial negative sequence proportion modulation signal from the dq rotating coordinate in DC values to an αβ coordinate (two-phase static coordinate system) in AC values.

The signal processing unit 104 further comprises an error calculation module 330 which receives the positive sequence modulation signals output from the positive sequence coordinate transformation module 320 and the negative sequence modulation signals output from the negative sequence coordinate transformation module 322 to output modulations signals $S_1$ and $S_2$.

The space vector modulation module 30 is electrically coupled between the signal processing unit 104 and the power conversion unit 106. The space vector modulation module 30 performs space conversion based on the modulation signals $S_1$ and $S_2$ output by the error calculation module 330 so as to form three-phase modulation signals $S_a$, $S_b$, $S_c$. The three-phase modulation signals $S_a$, $S_b$, $S_c$ may be pulse width modulation (PWM) signals or pulse frequency modulation (PFM) signals. In one embodiment, the above modulation signals $S_1$ and $S_2$ may be calculated by a digital calculation unit. The three-phase modulation signals $S_a$, $S_b$, $S_c$. The three-phase modulation signals $S_a$, $S_b$, $S_c$ are used for driving the power conversion unit 106 to absorb the negative sequence reactive currents from the three-phase AC grid 12 according to the three-phase modulation signals $S_a$, $S_b$, $S_c$ so as to reduce the negative sequence voltage at the output terminal of the power conversion unit 106 when the three-phase voltage signal $V_g$ is unbalanced.

Figure 4:
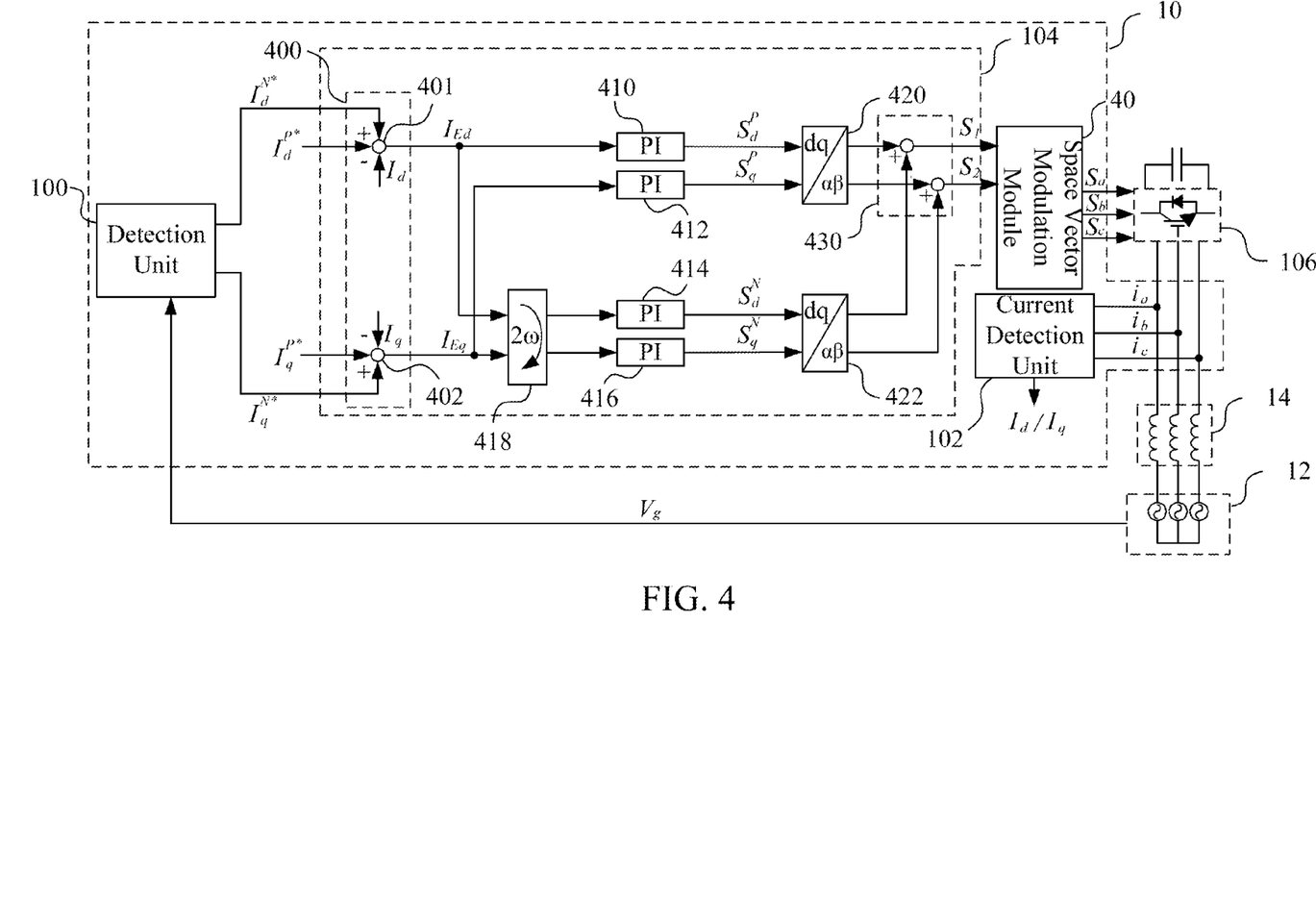
FIG. 4 is a detailed schematic diagram of a control device for a power conversion unit and a three-phase AC grid according to another embodiment of this disclosure.

FIG. 4 is a detailed schematic diagram of the control device 10, the power conversion unit 106, and the three-phase AC grid 12 according to another embodiment of this disclosure. In the present embodiment, the control device 10 further comprises a space vector modulation module 40 besides the detection unit 100, the current detection unit 102, and the signal processing unit 104.

According to the present embodiment, the negative sequence reactive current given signal generated based on the three-phase voltage signal $V_g$ by the detection unit 100 comprises a d-component $I_d^{N*}$ (that is, the first axial negative sequence reactive current given signal) and a q-component $I_q^{N*}$ (that is, the second axial negative sequence reactive current given signal) in the negative dq coordinate. In the present embodiment, the positive sequence current given signal comprises a d-component $I_d^{P*}$ (that is, the first axial positive sequence active current given signal) and a q-component $I_q^{P*}$ (that is, the second axial positive sequence reactive current given signal) in the positive dq coordinate. In one embodiment, the above d-component $i_d^{N*}$ and q-component $I_q^{N*}$ of the negative sequence reactive current given signal can be obtained by being transformed to the dq coordinate through the following formulae:

$$I_d^{N*}=(V_q^N/V^N)*I_R^{N*}\cos 2\omega t-(V_d^N/V^N)*I_R^{N*}\sin 2\omega t$$

$$I_q^{N*}=(V_d^N/V^N)*I_R^{N*}\cos 2\omega t-(V_q^N/V^N)*I_R^{N*}\sin 2\omega t$$

where $V^N$ denotes the negative sequence grid voltage signal, $V_d^N$ denotes the d-component of the negative sequence grid voltage signal, $V_q^N$ denotes the q-component of the negative sequence grid voltage signal, and $I_R^N$ denotes the peak value of the negative sequence reactive current absorbed by the power conversion unit 106 from the three-phase AC grid 12.

The current detection unit 102 generates a feedback current signal through detecting currents $i_a$, $i_b$, $i_c$ of the three-phase AC grid 12. The feedback current signal comprises a d-component $I_d$ (that is, the first axial feedback current signal) and a q-component $I_q$ (that is, the second axial feedback current signal).

In the present embodiment, the signal processing unit 104 further comprises a first error calculation module 400 which receives the feedback current signal, the positive sequence current given signal, and the negative sequence reactive current given signal and calculates and outputs a first axial error signal $I_{Ed}$ and a second axial error signal $I_{Eq}$. The first error calculation module 400 comprises a first axial error calculation module 401 and a second axial error calculation module 402. In addition, the signal processing unit 104 further comprises a positive sequence signal processing module and a negative sequence signal processing module. The positive sequence signal processing module further comprises a first positive sequence proportion adjustment module 410, a second positive sequence proportion adjustment module 412, and a positive sequence coordinate transformation module 420 so as to process the positive sequence signals. That is, the first axial error signal and the second axial error signal are received to output positive sequence modulation signals. The negative sequence signal processing module comprises a first negative sequence proportion adjustment module 414, a second negative sequence proportion adjustment module 416, a negative sequence coordinate module 418, and a negative sequence coordinate transformation module 422 so as to process the negative sequence signals. That is, the first axial error signal and the second axial error signal are received to output negative sequence modulation signals.

The first axial error calculation module 401 calculates the first axial error signal $I_{Ed}$ based on the d-component $I_d$ of the feedback current signal, the d-component $I_d^{P*}$ of the positive sequence current given signal (that is, the first axial positive sequence active current given signal) and the d-component $I_d^{N*}$ of the negative sequence reactive current given signal (that is, the first axial negative sequence reactive current given signal). The second axial error calculation module 402 calculates the second axial error signal $I_{Eq}$ based on the q-component $I_q$ of the feedback current signal, the q-component $I_q^{P*}$ of the positive sequence current given signal (that is, the second axial positive sequence reactive current given signal) and the q-component $I_q^{N*}$ of the negative sequence reactive current given signal (that is, the second axial negative sequence reactive current given signal).

The first positive sequence proportion adjustment module 410 receives the first axial error signal $I_{Ed}$ and calculates and outputs a first axial positive sequence proportion modulation signal $S_d^P$. The second positive sequence proportion adjustment module 412 receives the second axial error signal $I_{Eq}$ and calculates and outputs a second axial positive sequence proportion modulation signal $S_q^P$. Additionally, in the processing of the negative sequence signals, the first axial error signal $I_{Ed}$ and the second axial error signal $I_{Eq}$ are first received by the negative sequence coordinate module 418 and transformed to negative sequence error signals, that is, a first negative sequence error signal and a second negative sequence error signal. The first negative sequence proportion adjustment module 414 receives the first negative sequence error signal and calculates and outputs a first axial negative sequence proportion modulation signal $S_d^P$. The second negative sequence proportion adjustment module 416 receives the second negative sequence error signal and calculates and outputs a second axial negative sequence proportion modulation signal $S_q^N$.

The positive sequence coordinate transformation module 420 further transforms the first axial positive sequence proportion modulation signal $S_d^P$ and the second axial positive sequence proportion modulation signal $S_q^P$ from the dq coordinate in DC values to an αβ coordinate in AC values so as to output positive sequence modulation signals. The negative sequence coordinate transformation module 422 further transforms the first axial negative sequence proportion modulation signal $S_d^N$ and the second axial negative sequence proportion modulation signal $S_q^N$ from the dq coordinate in DC values to the αβ coordinate in AC values so as to output negative sequence modulation signals.

In the present embodiment, the signal processing unit 104 further comprises a second error calculation module 430 for receiving the positive sequence modulation signals and the negative sequence modulation signals after being coordinately transformed, and calculates and outputs modulation signals $S_1$ and $S_2$. The space vector modulation module 40 performs space conversion based on the modulation signals $S_1$ and $S_2$ so as to form three-phase modulation signals $S_a$, $S_b$, $S_c$. The power conversion unit 106 is then actuated by the three-phase modulation signals $S_a$, $S_b$, $S_c$ to absorb the negative sequence reactive currents from the three-phase AC grid 12 according to the three-phase modulation signals $S_a$, $S_b$, $S_c$ so as to reduce the negative sequence voltage at the output terminal of the power conversion unit 106 when the three-phase voltage signal $V_g$ is unbalanced.

With the present disclosure grid voltage adjusting device, the power conversion unit 106 absorbs the negative sequence reactive currents from the three-phase AC grid 12 after the imbalance of the three-phase voltage signal $V_g$ is detected so as to reduce the negative sequence voltage at the output terminal of the power conversion unit 106. As a result, the objective of dynamically adjusting the imbalance of the three-phase voltage signal $V_g$ is achieved.

It is noted that, in the above embodiments, calculations based on dq rotating coordinate and αβ coordinate serve as an example. In other embodiments, the amount of current can be calculated in other ways, not limited to the calculation method based on the coordinates disclosed in the above-mentioned embodiments.

Figure 5:
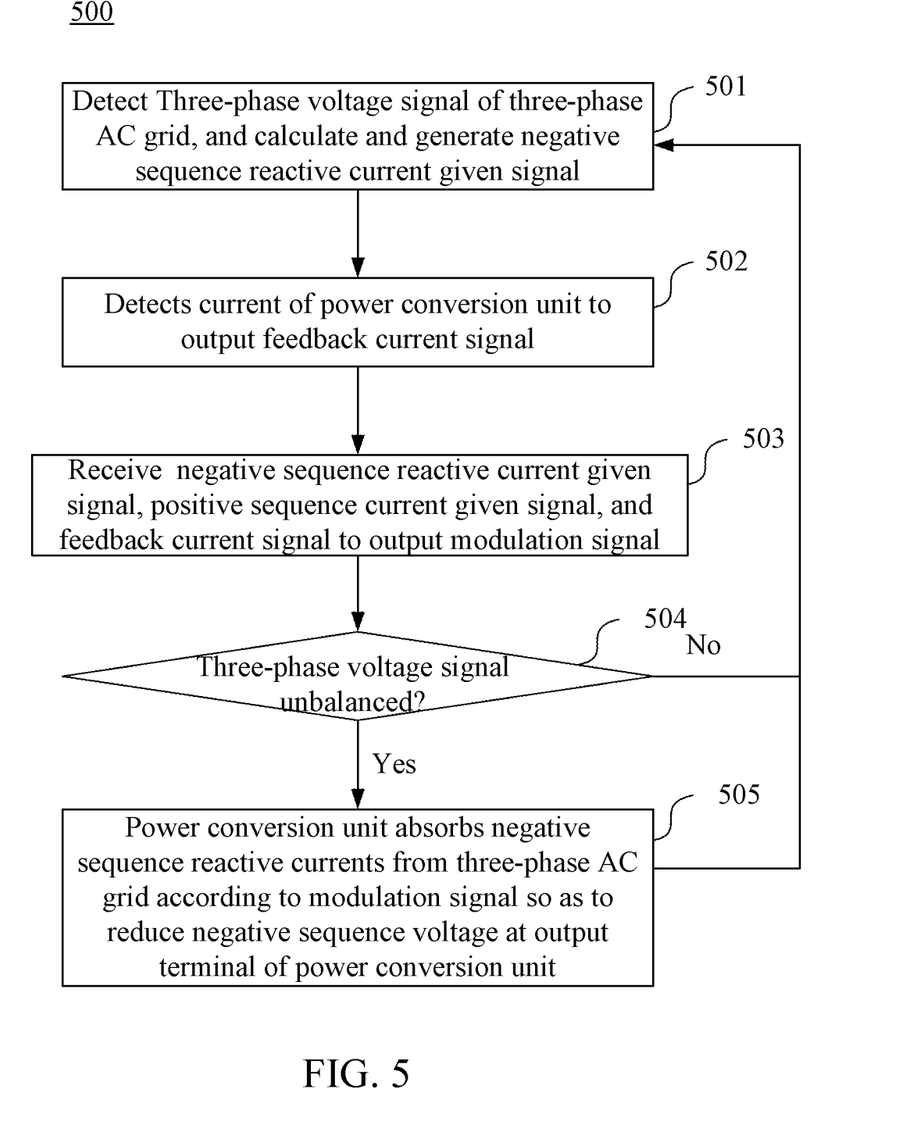
FIG. 5 depicts a flow chart of a method of controlling a power conversion unit according to one embodiment of this disclosure.

FIG. 5 depicts a flow chart of a method 500 of adjusting a grid voltage according to one embodiment of this disclosure. The method 500 of adjusting the grid voltage may be applied to the grid voltage adjusting device shown in FIG. 1 or FIG. 4.

In the following, a description is provided by way of the grid voltage adjusting device shown in FIG. 1. The method 500 of adjusting the grid voltage comprises the following steps.

In step 501, the detection unit 100 detects the three-phase voltage signal $V_g$ of the three-phase AC grid 12, and calculates and generates a negative sequence reactive current given signal.

In step 502, the current detection unit 102 detects a current of the power conversion unit 106 to output a feedback current signal.

In step 503, the signal processing unit 104 receives the negative sequence reactive current given signal, a positive sequence current given signal, and the feedback current signal to output a modulation signal.

In step 504, determine whether the three-phase voltage signal $V_g$ is unbalanced. If the three-phase voltage signal $V_g$ is not unbalanced, the flow goes back to step 501 to perform detection.

In step 505, the power conversion unit 106 absorbs negative sequence reactive currents from the three-phase AC grid 12 according to the modulation signal when the three-phase voltage signal $V_g$ is unbalanced so as to reduce a negative sequence voltage at an output terminal of the power conversion unit 106.

By utilizing the present disclosure method of adjusting the grid voltage, the power conversion unit 106 can absorb the negative sequence reactive currents from the three-phase AC grid 12 after the imbalance of the three-phase voltage signal $V_g$ is detected so as to reduce the negative sequence voltage at the output terminal of the power conversion unit 106. As a result, the objective of dynamically adjusting the imbalance of the three-phase voltage signal $V_g$ is achieved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A control device of a power conversion unit applied to a three-phase AC grid comprising:
    a detection unit configured for detecting a three-phase voltage signal of the three-phase AC grid and calculating and generating a negative sequence reactive current given signal;
    a current detection unit configured for detecting a current of the power conversion unit to output a feedback current signal; and
    a signal processing unit configured for receiving the negative sequence reactive current given signal, a positive sequence current given signal, and the feedback current signal to output a modulation signal;
    wherein the power conversion unit is electrically coupled to the signal processing unit and the three-phase AC grid, the power conversion unit absorbs negative sequence reactive currents from the three-phase AC grid according to the modulation signal when the three-phase voltage signal is unbalanced so as to reduce a negative sequence voltage at an output terminal of the power conversion unit.

2. The control device of the power conversion unit of claim 1, wherein the positive sequence current given signal comprises a first axial positive sequence active current given signal and a second axial positive sequence reactive current given signal, the negative sequence reactive current given signal comprises a first axial negative sequence reactive current given signal and a second axial negative sequence reactive current given signal.

3. The control device of the power conversion unit of claim 2, wherein the first axis and the second axis are determined based on a dq coordinate.

4. The control device of the power conversion unit of claim 1, further comprising a space vector modulation module electrically coupled between the signal processing unit and the power conversion unit, the space vector modulation module being configured for receiving the modulation signal and converting the modulation signal to a three-phase modulation signal and outputting the three-phase modulation signal to the power conversion unit.

5. The control device of the power conversion unit of claim 2, wherein the current detection unit further comprises a positive and negative sequence separation module to separate the feedback current signal so as to output a positive sequence feedback current signal and a negative sequence feedback current signal.

6. The control device of the power conversion unit of claim 5, wherein the signal processing unit further comprises a positive sequence signal processing module, a negative sequence signal processing module and an error calculation module, the positive sequence signal processing module receives the positive sequence feedback current signal and the positive sequence current given signal to output a positive sequence modulation signal, the negative sequence signal processing module receives the negative sequence feedback current signal and the negative sequence reactive current given signal to output a negative sequence modulation signal, and the error calculation module receives the positive sequence modulation signal and the negative sequence modulation signal to calculate and output the modulation signal.

7. The control device of the power conversion unit of claim 5, wherein the positive sequence feedback current signal comprises a first axial positive sequence feedback current signal and a second axial positive sequence feedback current signal, the negative sequence feedback current signal comprises a first axial negative sequence feedback current signal and a second axial negative sequence feedback current signal.

8. The control device of the power conversion unit of claim 7, wherein the positive sequence signal processing module further comprises a first positive sequence error calculation module, a second positive sequence error calculation module, a first positive sequence proportion adjustment module, a second positive sequence proportion adjustment module, and a positive sequence coordinate transformation module, the first positive sequence error calculation module receives the first axial positive sequence active current given signal and the first axial positive sequence feedback current signal to output a first axial positive sequence error signal, the second positive sequence error calculation module receives the second axial positive sequence reactive current given signal and the second axial positive sequence feedback current signal to output a second axial positive sequence error signal, the first positive sequence proportion adjustment module receives the first axial positive sequence error signal to calculate and output a first axial positive sequence proportion modulation signal, the second positive sequence proportion adjustment module receives the second axial positive sequence error signal to calculate and output a second axial positive sequence proportion modulation signal, the positive sequence coordinate transformation module receives the first axial positive sequence proportion modulation signal and the second axial positive sequence proportion modulation signal to output the positive sequence modulation signal.

9. The control device of the power conversion unit of claim 8, wherein the positive sequence coordinate transformation module transforms the first axial positive sequence proportion modulation signal and the second axial positive sequence proportion modulation signal from a dq coordinate to an αβ coordinate.

10. The control device of the power conversion unit of claim 7, wherein the negative sequence signal processing module further comprises a first negative sequence error calculation module, a second negative sequence error calculation module, a first negative sequence proportion adjustment module, a second negative sequence proportion adjustment module, and a negative sequence coordinate transformation module, the first negative sequence error calculation module receives the first axial negative sequence reactive current given signal and the first axial negative sequence feedback current signal to output a first axial negative sequence error signal, the second negative sequence error calculation module receives the second axial negative sequence reactive current given signal and the second axial negative sequence feedback current signal to output a second axial negative sequence error signal, the first negative sequence proportion adjustment module receives the first axial negative sequence error signal to calculate and output a first axial negative sequence proportion modulation signal, the second negative sequence proportion adjustment module receives the second axial negative sequence error signal to calculate and output a second axial negative sequence proportion modulation signal, the negative sequence coordinate transformation module receives the first axial negative sequence proportion modulation signal and the second axial negative sequence proportion modulation signal to output the negative sequence modulation signal.

11. The control device of the power conversion unit of claim 10, wherein the negative sequence coordinate transformation module transforms the first axial negative sequence proportion modulation signal and the second axial negative sequence proportion modulation signal from a dq coordinate to an αβ coordinate.

12. The control device of the power conversion unit of claim 2, wherein the signal processing unit further comprises a first error calculation module, a positive sequence signal processing module, a negative sequence signal processing module and a second error calculation module, the first error calculation module receives the feedback current signal, the positive sequence current given signal, and the negative sequence reactive current given signal to calculate and output a first axial error signal and a second axial error signal, the positive sequence signal processing module receives the first axial error signal and the second axial error signal to output a positive sequence modulation signal, the negative sequence signal processing module receives the first axial error signal and the second axial error signal to output a negative sequence modulation signal, the second error calculation module receiving the positive sequence modulation signal and the negative sequence modulation signal to calculate and output the modulation signal.

13. The control device of the power conversion unit of claim 12, wherein the feedback current signal comprises a first axial feedback current signal and a second axial feedback current signal.

14. The control device of the power conversion unit of claim 13, wherein the first error calculation module further comprises a first axial error calculation module and a second axial error calculation module, the first axial error calculation module receives the first axial positive sequence active current given signal, the first axial negative sequence reactive current given signal, and the first axial feedback current signal to calculate and output the first axial error signal, the second axial error calculation module receives the second axial positive sequence reactive current given signal, the second axial negative sequence reactive current given signal, and the second axial feedback current signal to calculate and output the second axial error signal.

15. The control device of the power conversion unit of claim 13, wherein the positive sequence signal processing module comprises a first positive sequence proportion adjustment module, a second positive sequence proportion adjustment module, and a positive sequence coordinate transformation module, the first positive sequence proportion adjustment module receives the first axial error signal to calculate and output a first axial positive sequence proportion modulation signal, the second positive sequence proportion adjustment module receives the second axial error signal to calculate and output a second axial positive sequence proportion modulation signal, the positive sequence coordinate transformation module receives the first axial positive sequence proportion modulation signal and the second axial positive sequence proportion modulation signal to output the positive sequence modulation signal.

16. The control device of the power conversion unit of claim 15, wherein the positive sequence coordinate transformation module transforms the first axial positive sequence proportion modulation signal and the second axial positive sequence proportion modulation signal from a dq coordinate to an $\alpha\beta$ coordinate.

17. The control device of the power conversion unit of claim 13, wherein the negative sequence signal processing module comprises a negative sequence coordinate module, a first negative sequence proportion adjustment module, a second negative sequence proportion adjustment module, and a negative sequence coordinate transformation module, the negative sequence coordinate module receives the first axial error signal and the second axial error signal to transform the first axial error signal and the second axial error signal to a first negative sequence error signal and a second negative sequence error signal, the first negative sequence proportion adjustment module receives the first negative sequence error signal to calculate and output a first axial negative sequence proportion modulation signal, the second negative sequence proportion adjustment module receives the second negative sequence error signal to calculate and output a second axial negative sequence proportion modulation signal, the negative sequence coordinate transformation module receives the first axial negative sequence proportion modulation signal and the second axial negative sequence proportion modulation signal to output the negative sequence modulation signal.

18. The control device of the power conversion unit of claim 17, wherein the negative sequence coordinate transformation module transforms the first axial negative sequence proportion modulation signal and the second axial negative sequence proportion modulation signal from a dq coordinate to an $\alpha\beta$ coordinate.

19. The control device of the power conversion unit of claim 1, wherein the power conversion unit is electrically coupled to the three-phase AC grid through an impedance and a filtering inductor.

20. The control device of the power conversion unit of claim 1, wherein the power conversion unit comprises a plurality of insulated gate bipolar transistors or a plurality of integrated gate-commutated thyristors.

21. The control device of the power conversion unit of claim 1, wherein the power conversion unit is electrically coupled to the three-phase AC grid through at least one filtering inductor.

22. A method of controlling a power conversion unit applied to a three-phase AC grid comprising:
    detecting a three-phase voltage signal of the three-phase AC grid and calculating and generating a negative sequence reactive current given signal by a detection unit;
    detecting a current of the power conversion unit to output a feedback current signal by a current detection unit;
    receiving the negative sequence reactive current given signal, a positive sequence current given signal, and the feedback current signal to output a modulation signal by a signal processing unit; and
    electrically coupling the power conversion unit to the signal processing unit and the three-phase AC grid, the power conversion unit absorbing negative sequence reactive currents from the three-phase AC grid according to the modulation signal when the three-phase voltage signal is unbalanced so as to reduce a negative sequence voltage at an output terminal of the power conversion unit.

23. The method of controlling the power conversion unit of claim 22, wherein the positive sequence current given signal comprises a first axial positive sequence active current given signal and a second axial positive sequence reactive current given signal, the negative sequence reactive current given signal comprises a first axial negative sequence reactive current given signal and a second axial negative sequence reactive current given signal.

24. The method of controlling the power conversion unit of claim 22, further comprising converting the modulation signal to a three-phase modulation signal so as to control the power conversion unit according to the three-phase modulation signal.

25. The method of controlling the power conversion unit of claim 23, further comprising performing a positive and negative sequence separation to the feedback current signal so as to output a positive sequence feedback current signal and a negative sequence feedback current signal.

26. The method of controlling the power conversion unit of claim 25, further comprising receiving the positive sequence feedback current signal and the positive sequence current given signal to output a positive sequence modulation signal by a positive sequence signal processing module of the signal processing unit, and receiving the negative sequence feedback current signal and the negative sequence reactive current given signal to output a negative sequence modulation signal by a negative sequence signal processing module of the signal processing unit, and receiving the positive sequence modulation signal and the negative sequence modulation signal to calculate and output the modulation signal by an error calculation module.

27. The method of controlling the power conversion unit of claim 26, wherein the positive sequence feedback current signal comprises a first axial positive sequence feedback current signal and a second axial positive sequence feedback current signal, the negative sequence feedback current signal comprises a first axial negative sequence feedback current signal and a second axial negative sequence feedback current signal.

28. The method of controlling the power conversion unit of claim 27, further comprising receiving the first axial positive sequence active current given signal and the first axial positive sequence feedback current signal to output a first axial positive sequence error signal by a first positive sequence error calculation module of the positive sequence signal processing module, receiving the second axial positive sequence reactive current given signal and the second axial positive sequence feedback current signal to output a second axial positive sequence error signal by a second positive sequence error calculation module of the positive sequence signal processing module, receiving the first axial positive sequence error signal to calculate and output a first axial positive sequence proportion modulation signal by a first positive sequence proportion adjustment module of the positive sequence signal processing module, receiving the second axial positive sequence error signal to calculate and output a second axial positive sequence proportion modulation signal by a second positive sequence proportion adjustment module of the positive sequence signal processing module, and receiving the first axial positive sequence proportion modulation signal and the second axial positive sequence proportion modulation signal to output the positive sequence modulation signal by a positive sequence coordinate transformation module of the positive sequence signal processing module.

29. The method of controlling the power conversion unit of claim 27, further comprising receiving the first axial negative sequence reactive current given signal and the first axial negative sequence feedback current signal to output a first axial negative sequence error signal by a first negative sequence error calculation module of the negative sequence signal processing module, receiving the second axial negative sequence reactive current given signal and the second axial negative sequence feedback current signal to output a second axial negative sequence error signal by a second negative sequence error calculation module of the negative sequence signal processing module, receiving the first axial negative sequence error signal to calculate and output a first axial negative sequence proportion modulation signal by a first negative sequence proportion adjustment module of the negative sequence signal processing module, receiving the second axial negative sequence error signal to calculate and output a second axial negative sequence proportion modulation signal by a second negative sequence proportion adjustment module of the negative sequence signal processing module, receiving the first axial negative sequence proportion modulation signal and the second axial negative sequence proportion modulation signal to output the negative sequence modulation signal by a negative sequence coordinate transformation module of the negative sequence signal processing module.

30. The method of controlling the power conversion unit of claim 23, further comprising receiving the feedback current signal, the positive sequence current given signal, and the negative sequence reactive current given signal to calculate and output a first axial error signal and a second axial error signal by a first error calculation module of the signal processing unit, receiving the first axial error signal and the second axial error signal to output a positive sequence modulation signal by a positive sequence signal processing module of the signal processing unit, and receiving the first axial error signal and the second axial error signal to output a negative sequence modulation signal by a negative sequence signal processing module of the signal processing unit, receiving the positive sequence modulation signal and the negative sequence modulation signal to calculate and output the modulation signal by a second error calculation module of the signal processing unit.

31. The method of controlling the power conversion unit of claim 30, wherein the feedback current signal comprises a first axial feedback current signal and a second axial feedback current signal.

32. The method of controlling the power conversion unit of claim 31, further comprising receiving the first axial positive sequence active current given signal, the first axial negative sequence reactive current given signal, and the first axial feedback current signal to calculate and output the first axial error signal by a first axial error calculation module of the first error calculation module, and receiving the second axial positive sequence reactive current given signal, the second axial negative sequence reactive current given signal, and the second axial feedback current signal to calculate and output the second axial error signal by a second axial error calculation module of the first error calculation module.

33. The method of controlling the power conversion unit of claim 30, further comprising receiving the first axial error signal to calculate and output a first axial positive sequence proportion modulation signal by a first positive sequence proportion adjustment module of the positive sequence signal processing module, receiving the second axial error signal to calculate and output a second axial positive sequence proportion modulation signal by a second positive sequence proportion adjustment module of the positive sequence signal processing module, and receiving the first axial positive sequence proportion modulation signal and the second axial positive sequence proportion modulation signal to output the positive sequence modulation signal by a positive sequence coordinate transformation module of the positive sequence signal processing module.

34. The method of controlling the power conversion unit of claim 30, further comprising receiving the first axial error signal and the second axial error signal to transform the first axial error signal and the second axial error signal to a first negative sequence error signal and a second negative sequence error signal by a negative sequence coordinate module of the negative sequence signal processing module, receiving the first negative sequence error signal to calculate and output a first axial negative sequence proportion modulation signal by a first negative sequence proportion adjustment module of the negative sequence signal processing module, receiving the second negative sequence error signal to calculate and output a second axial negative sequence proportion modulation signal by a second negative sequence proportion adjustment module of the negative sequence signal processing module, and receiving the first axial negative sequence proportion modulation signal and the second axial negative sequence proportion modulation signal to output the negative sequence modulation signal by a negative sequence coordinate transformation module of the negative sequence signal processing module.

* * * * *